United States Patent
Raghavan et al.

(10) Patent No.: US 6,441,759 B1
(45) Date of Patent: Aug. 27, 2002

(54) MULTI-BIT ΔΣ MODULATOR HAVING LINEAR OUTPUT

(75) Inventors: Gopal Raghavan, Thousand Oaks; Henrik T. Jensen, Brentwood, both of CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 09/651,744

(22) Filed: Aug. 30, 2000

(51) Int. Cl.[7] ............................................... H03M 3/00
(52) U.S. Cl. ........................ 341/143; 341/118; 341/144; 341/155
(58) Field of Search ............................... 341/143, 155, 341/156, 101, 144, 145, 146, 118, 164, 110

(56) References Cited

U.S. PATENT DOCUMENTS

| 4,990,914 A | * | 2/1991 | Giancarlo | 341/143 |
|---|---|---|---|---|
| 5,073,777 A | * | 12/1991 | Fukuhara et al. | 341/131 |
| 5,181,032 A | * | 1/1993 | Ribner | 341/143 |
| 5,305,004 A | | 4/1994 | Fattaruso | |
| 5,311,181 A | * | 5/1994 | Ferguson et al. | 341/143 |
| 5,404,142 A | | 4/1995 | Adams et al. | |
| 5,406,283 A | | 4/1995 | Leung | |
| 5,493,297 A | * | 2/1996 | Nguyen et al. | 341/118 |
| 5,659,315 A | * | 8/1997 | Mandl | 341/143 |
| 5,684,482 A | | 11/1997 | Galton | |
| 5,719,573 A | * | 2/1998 | Leung et al. | 341/143 |
| 6,021,172 A | * | 2/2000 | Fossum et al. | 377/60 |

* cited by examiner

Primary Examiner—Brian Young
Assistant Examiner—John Nguyen
(74) Attorney, Agent, or Firm—Ladas & Parry

(57) ABSTRACT

An apparatus and method of improving linearity of a multi bit ΔΣ modulator in which the output of a multi-bit quantizer of a ΔΣ modulator is connected in a feedback loop to a converter where output is a higher frequency single bit data stream which is supplied to a 1-bit digital to analog converter whose output is fed back to the quantizer to provide linearity of the output of the ΔΣ modulator.

14 Claims, 1 Drawing Sheet

MULTI-BIT ΔΣ MODULATOR HAVING LINEAR OUTPUT

FIELD OF THE INVENTION

The invention relates to multi bit ΔΣ modulators having feedback loops and wherein the linearity of the output of the modulator is improved.

The invention further relates to methods for improving the linearity of the multi bit ΔΣ modulators.

BACKGROUND AND PRIOR ART

Multi bit ΔΣ modulators are well known and conventionally their outputs are fed back through a multi bit digital to analog converter (DAC). Non-linearity in the quantizer of the modulator is reduced by the gain in the forward loop but does not limit overall modulator linearity. However, non-linearity in the DAC is a serious problem as this is directly referred to the input. To overcome this problem numerous techniques have been developed and primarily rely on switching in a multiplicity of unit DAC cells and shuffling them in some form on each cycle to spread the mismatch error over the entire frequency band.

A number of patents also disclose solutions to the non-linearity problem in multi bit DACs and modulators.

U.S. Pat. No. 5,404,142 discloses a data director scrambler for multi bit noise shaping digital analog converters.

U.S. Pat. No. 5,305,004 discloses a digital to analog converter for ΔΣ modulators.

U.S. Pat. No. 5,684,482 discloses spectral shaping of circuit errors in digital to analog converters.

U.S. Pat. No. 5,406,283 discloses multi bit over-sampled digital to analog converters with dynamic element matching.

The prior art techniques utilize a multi bit DAC composed of multiple one bit digital analog converters in the feedback path and circuitry which selects the DAC combinations to be used at any given time. The main problem with these solutions is that an excessive amount of extra circuitry is required to implement the technique. Additionally the techniques are limited to the energy they can actually disperse over the frequency band.

Reference is next made to FIG. 1 which shows a conventional ΔΣ modulator circuit 1 in which a multi bit quantizer Q is connected in a feedback loop FL containing a multi bit DAC. Non-linearity and DC offsets in the quantizer Q are not significant as the quantizer is usually preceded by several high gain stages and the input referred error is thus reduced by this gain. However, non-linearities in the DAC in the feedback loop are directly input referred and critical in determining overall modulator linearity.

If N is assumed to be the output of the M bit quantizer, conventional techniques for removal of non-linearity in the DAC are based on having multiple unit DACs and then selecting N of these units randomly or in some preset fashion. Mismatch between the error is noise shaped. Both techniques require a multi bit DAC in the feedback loop as well as extra logic elements, such as the shuffle logic shown in FIG. 1 to determine which of the units are chosen.

SUMMARY OF THE INVENTION

An object of the invention is to provide a ΔΣ modulator of simple construction in which linearity is improved.

Multi bit ΔΣ modulators are becoming more wide spread in use as the demand for higher signal to noise ratios increases and the solution of the nonlinearity problem associated with the multi bit ΔΣ modulators is a significant achievement of the invention.

In accordance with the invention, a single bit DAC is included in the feedback loop which is inherently linear by definition. The multi bit output of the modulator is converted to a single bit output in the time domain by using a clock frequency higher than the sampling frequency. The multi bit output is converted either to a stream of N single pulses or a pulse width corresponding to N (where N is a number representing the output of the multi bit quantizer). Such a transformation can be performed easily with minimal circuit complexity and is readily suited to ultra fast circuit technology. Accordingly, a multi bit ΔΣ modulator is obtained which is substantially more linear, but which requires minimal complexity compared to conventional modulators.

DETAILED DESCRIPTION

Figure 1:
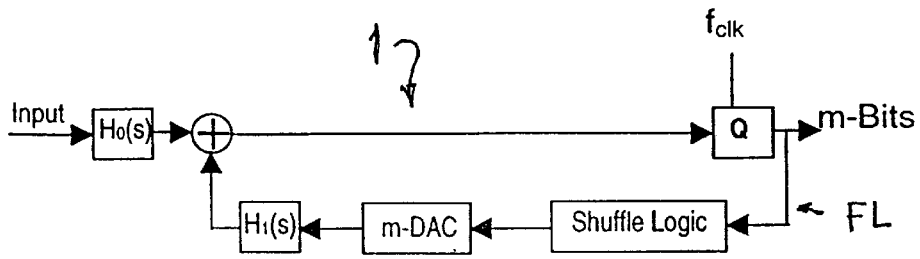
FIG. 1 is a diagrammatic illustration of a modulator circuit according to the prior art.
Figure 2:
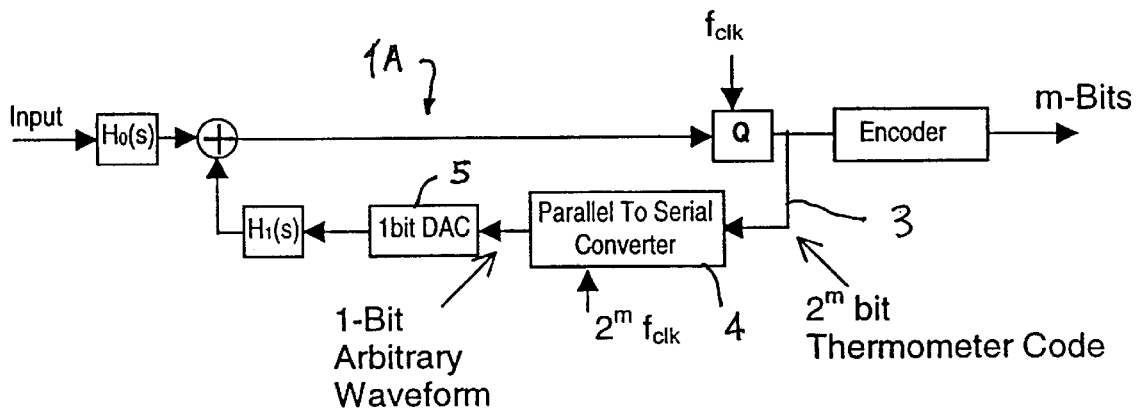
FIG. 2 is a diagrammatic circuit illustration of one embodiment of a ΔΣ modulator according to the invention.

Referring to FIG. 2 therein is shown a modulator circuit 1A containing a quantizer Q operating at a clock frequency $f_{clk}$. The quantizer Q is a multi bit flash quantizer Q having $2^m$ comparators to produce a $2^m$ bit thermometer-coded output 3. If N is the count of the final quantizer output, the outputs of the lower end comparators are at a digital 1 while the outputs of the upper ($2^m-N$) comparators are at digital 0. The output of the quantizer is fed to a parallel to serial converter 4 operating at a frequency $2^m f_{clk}$ and is used to read out this sequence of bits and apply it to the input of a 1 bit DAC 5. If the M bit quantizer Q was fully saturated to $2^m$, digital 1's will be applied to the input of DAC 5. Accordingly, for a count of N on the quantizer, $N/2^m$ amounts of energy will be supplied to the input of the DAC 5 compared to the full count condition. Since the only requirement is that the pulses be of identical wave form, shapes such as Return to Zero (RZ), they can be utilized to minimize clock jitter and DAC thermal hystersis which further improves modulator performance.

Figure 3:
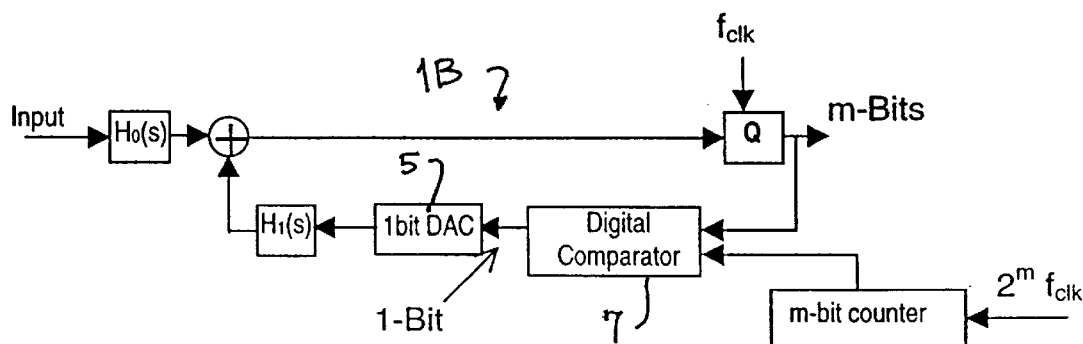
FIG. 3 is a diagrammatic illustration of another embodiment of a multi bit modulator according to the invention.

In the modulator circuit 1B in FIG. 3, the output of the quantizer Q us fed to an encoder from which the m-bits output of the modulator is obtained. The m-bits output of the modulator is also fed to a digital comparator 7 which is also connected to the output of an M bit counter 8 operating at a frequency of $2^m f_{clk}$. The counter is reset to zero at the beginning of every sampling instant and then starts counting up. The counter output is digitally compared to the quantizer output and the comparator output is connected to the 1-bit DAC 5. In this embodiment, the energy in the 1-bit feedback signal is linearly proportional to the comparator count. However, the choice of wave form is somewhat more limited in this embodiment than that of FIG. 2.

From the above it is seen that the apparatus and method of the invention improves linearity of the multi bit ΔΣ modulator by connecting the output of the multi bit quantizer of the modulator in a feedback loop containing a 1-bit digital analog converter and converting the output of the quantizer to a higher frequency single bit data stream for supply to the input of the 1-bit DAC.

Although the invention is disclosed with reference to particular embodiments thereof, it will become apparent to those skilled in the art that numerous modifications and variations can be made which will fall within the scope and spirit of the invention as defined by the attached claims.

What is claimed is:

1. A ΔΣ modulator comprising a multi bit quantizer having an input and an output, and a feedback loop connected from the output of the quantizer back to the input thereof, a 1 bit digital to analog converter in said feedback loop, and converter means connected between the output of the quantizer and an input of the 1-bit digital to analog converter for converting an m-bit output of the quantizer to a 1-bit output which is input to said 1-bit digital to analog converter, to provide substantial linearity of the output of the modulator.

2. A ΔΣ modulator as claimed in claim 1, wherein said quantizer comprises a multi bit flash quantizer having $2^m$ comparators.

3. A ΔΣ as claimed in claim 1, wherein said converter means comprises a parallel to serial converter in said feedback loop between the output of the quantizer and the input of the 1 bit digital to analog converter.

4. A ΔΣ modulator as claimed in claim 1, wherein said converter means comprises an M bit counter and a digital comparator connected to said counter to produce said 1-bit output.

5. A ΔΣ modulator as claimed in claim 4, wherein said M-bit counter is operated at a frequency $2^m f_{clk}$.

6. A method of improving linearity of multi bit ΔΣ modulation comprising connecting the output of a multi-bit quantizer of a ΔΣ modulator in a feedback loop, converting said output to a higher frequency single bit data stream and driving a 1-bit digital to analog converter with said single bit data stream, the output of the 1-bit digital to analog converter being connected to the input of the quantizer whereby to provide linearity of the output of the ΔΣ modulator.

7. A method as claimed in claim 6, wherein said converting is effected in a parallel to serial converter.

8. A method as claimed in claim 6, wherein said converting is effected in a digital comparator in which the output of the quantizer in the feedback loop is compared with the output of an m-bit converter.

9. A ΔΣ modulator comprising:
   a multi bit quantizer operating at a clock frequency $f_{clk}$, and having an input and an output;
   a feedback loop connected from the output of the quantizerback to the input thereof;
   a 1-bit digital to analog converter in said feedback loop; and
   a converter connected between the output of the quantizer and an input of the 1-bit digital to analog converter for converting a m-bit output of the quantizer to a 1-bit output at a frequency higher than the clock frequency, which is input to said 1-bit digital to analog converter to provide substantial linearity of the output of the modulator.

10. The ΔΣ modulator as claimed in claim 9, wherein said quantizer comprises a multi bit flash quantizer having $2^m$ comparators.

11. The ΔΣ modulator as claimed in claim 9, wherein-said converter is a parallel to serial converter in said feedback loop between the output of the quantizer and the input of the 1 bit digital to analog converter.

12. The ΔΣ modulator as claimed in claim 9, wherein said converter is a M-bit counter and a digital comparator connected to said counter to produce said 1-bit output.

13. The ΔΣ modulator as claimed in claim 11, wherein the parallel to serial converter is operated at a frequency $2^m f_{clk}$.

14. The ΔΣ modulator as claimed in claim 12, wherein said M-bit counter is operated at a frequency $2^m f_{clk}$.

* * * * *